(12) United States Patent
Chien et al.

(10) Patent No.: US 11,223,337 B2
(45) Date of Patent: Jan. 11, 2022

(54) LOGARITHMIC POWER DETECTOR

(71) Applicant: RichWave Technology Corp., Taipei (TW)

(72) Inventors: Hwey-Ching Chien, Taipei (TW); Chun-Han Tai, Taipei (TW)

(73) Assignee: RichWave Technology Corp., Taipei (TW)

( * ) Notice: Subject to any disclaimer, the term of this patent is extended or adjusted under 35 U.S.C. 154(b) by 30 days.

(21) Appl. No.: 16/990,967

(22) Filed: Aug. 11, 2020

(65) Prior Publication Data
US 2021/0067108 A1 Mar. 4, 2021

(30) Foreign Application Priority Data
Aug. 30, 2019 (TW) .................................. 108131163

(51) Int. Cl.
*H03F 1/32* (2006.01)
*H03F 3/24* (2006.01)

(52) U.S. Cl.
CPC ....... *H03F 3/245* (2013.01); *H03F 2200/105* (2013.01); *H03F 2200/171* (2013.01); *H03F 2200/222* (2013.01); *H03F 2200/462* (2013.01); *H03F 2200/504* (2013.01)

(58) Field of Classification Search
CPC ....................................................... H03F 1/32
USPC ............................................. 330/124 R, 295
See application file for complete search history.

(56) References Cited

U.S. PATENT DOCUMENTS

| 7,212,748 B2 * | 5/2007 | Koga | H04L 7/0278 |
| | | | 398/202 |
| 2003/0156668 A1 * | 8/2003 | Atkinson | B01J 19/123 |
| | | | 375/345 |
| 2003/0157912 A1 * | 8/2003 | Atkinson | B01F 5/246 |
| | | | 455/234.1 |
| 2010/0301972 A1 * | 12/2010 | Alkan | H01R 24/52 |
| | | | 333/22 R |
| 2016/0126921 A1 | 5/2016 | Hur | |

FOREIGN PATENT DOCUMENTS

| CN | 109950696 A | 6/2019 |
| EP | 3 447 897 A1 | 2/2019 |
| TW | 200945837 | 11/2009 |
| WO | 2017/216839 A1 | 12/2017 |

* cited by examiner

*Primary Examiner* — Henry Choe
(74) *Attorney, Agent, or Firm* — Winston Hsu (57) ABSTRACT

A logarithmic power detector includes a power distributor, a first detection circuit, a second detection circuit and an output circuit. The power distributor is used to generate a first power signal and a second power signal according to an input signal. The first detection circuit is used to attenuate the first power signal to generate a first rectified signal, filter the first rectified signal to generate a first low-pass signal, and amplify the first low-pass signal to generate a first amplification current. The second detection circuit is used to attenuate the second power signal to generate a second rectified signal, filter the second rectified signal to generate a second low-pass signal, and amplify the second low-pass signal to generate a second amplification current. The output circuit is used to receive the first amplification current and the second amplification current to generate a converted voltage related to the input signal.

21 Claims, 7 Drawing Sheets

LOGARITHMIC POWER DETECTOR

CROSS REFERENCE TO RELATED APPLICATION

This non-provisional application claims priority of Taiwan patent application No. 108131163, filed on 30 Aug. 2019, included herein by reference in its entirety.

TECHNICAL FIELD

The invention relates to electronic circuits, and in particular, to a logarithmic power detector.

BACKGROUND

In radio frequency (RF) communication, the power amplifier generates RF signals for transmission via an antenna. The power of the RF signal needs to be controlled within a specific power range to enable transmission within the predetermined coverage while reducing signal interference. The logarithmic power detector detects the power of the RF signal and controls the power amplifier to adjust the power of the RF signal. However, the conventional logarithmic power detector cannot accurately measure the power of the RF signal, and its operation bandwidth is limited.

Therefore, a logarithmic power detector is needed to accurately detect the power of the input signal and increase the linearity and operational bandwidth of the output signal.

SUMMARY

According to one embodiment, a logarithmic power detector includes an input terminal, a power distributor, a first detecting circuit, a second detecting circuit and an output circuit. The input terminal is used to receive an input signal. The power distributor is coupled to the input terminal and used to generate a first power signal and a second power signal according to the input signal. The first detecting circuit is coupled to the power distributor and includes a first half-wave rectifier, a first low-pass filter and a first buffer. The first half-wave rectifier is coupled to the power distributor and used to attenuate half cycles of the first power signal to generate a first rectified signal. The first low-pass filter is coupled to the first half-wave rectifier and used to pass the first rectified signal to generate a first low-pass signal. The first buffer is coupled to the first low-pass filter and used to amplify the first low-pass signal to generate a first amplified current. The second detecting circuit is coupled to the power distributor and includes a second half-wave rectifier, a second low-pass filter and a second buffer. The second half-wave rectifier is coupled to the power distributor and used to attenuate half cycles of the second power signal to generate a second rectified signal. The second low-pass filter is coupled to the second half-wave rectifier and used to pass the second rectified signal to generate a second low-pass signal. The second buffer is coupled to the second low-pass filter and used to amplify the second low-pass signal to generate a second amplified current. The output circuit is coupled to the first buffer and the second buffer and used to receive the first amplified current and the second amplified current to generate a converted voltage. The converted voltage is related to power of the input signal.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
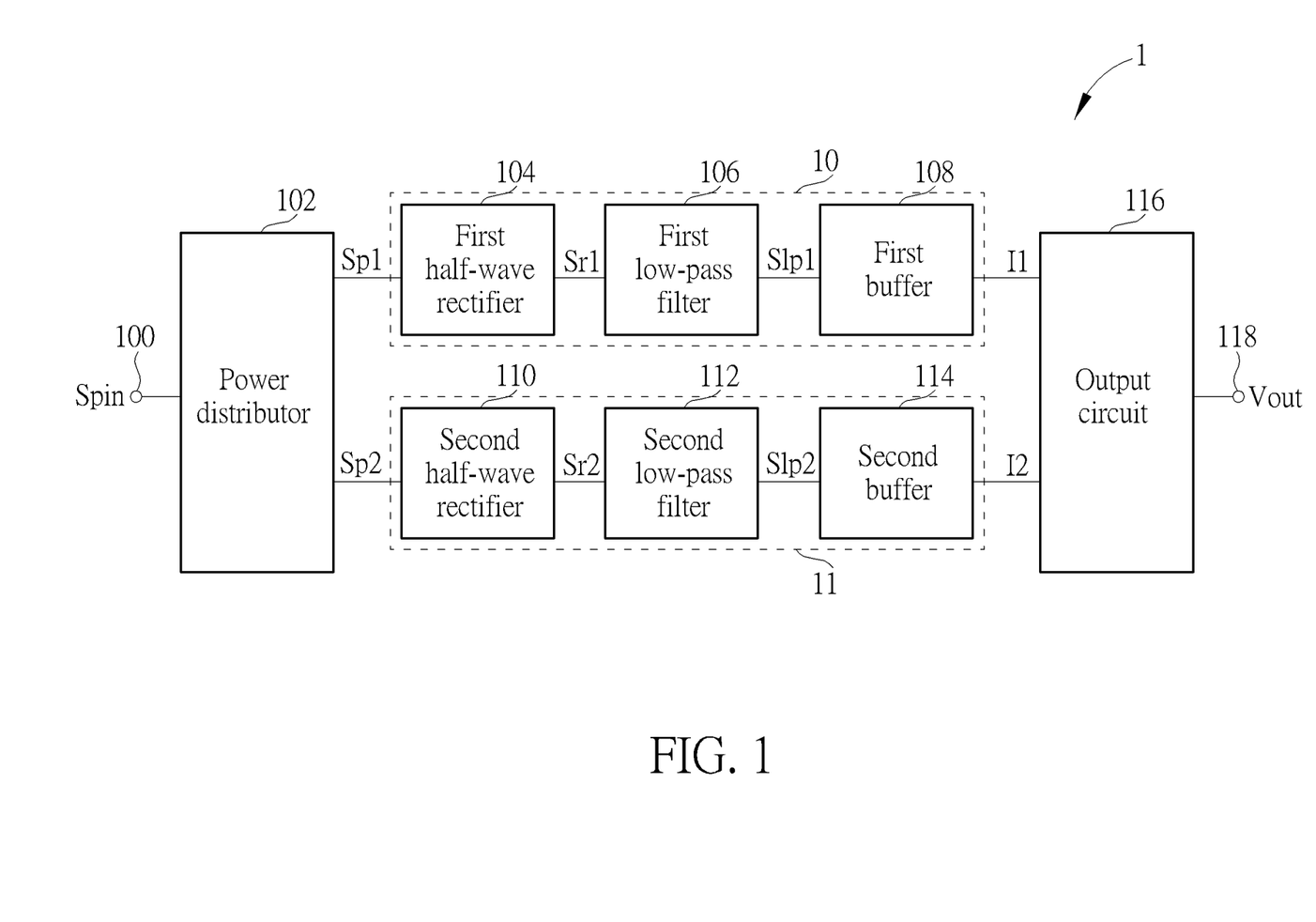
FIG. 1 is a block diagram of a logarithmic power detector according to an embodiment of the invention.

FIG. 1 is a block diagram of a logarithmic power detector 1 according to an embodiment of the invention. The logarithmic power detector 1 may receive an input signal Spin and generate a converted voltage Vout substantially proportional to the power of the input signal Spin, so as to accurately detect the power of the input signal Spin. The input signal Spin may be, but is not limited to, an alternating current (AC) signal, e.g. a radio frequency (RF) signal.

The logarithmic power detector 1 may include an input terminal 100, a power distributor 102, a first detecting circuit 10, a second detecting circuit 11, an output circuit 116 and an output terminal 118. The power distributor 102 may distribute the input signal Spin to the first detecting circuit 10 and the second detecting circuit 11 so that the first detecting circuit 10 and/or the second detecting circuit 11 may respectively detect a power segment of the input signal Spin to generate a combined current related to the input signal Spin. The combined current may be converted into the converted voltage Vout by the output circuit 116, and the converted voltage Vout may be converted into an output voltage Vpout by an AC-to-DC converter.

Figure 2:
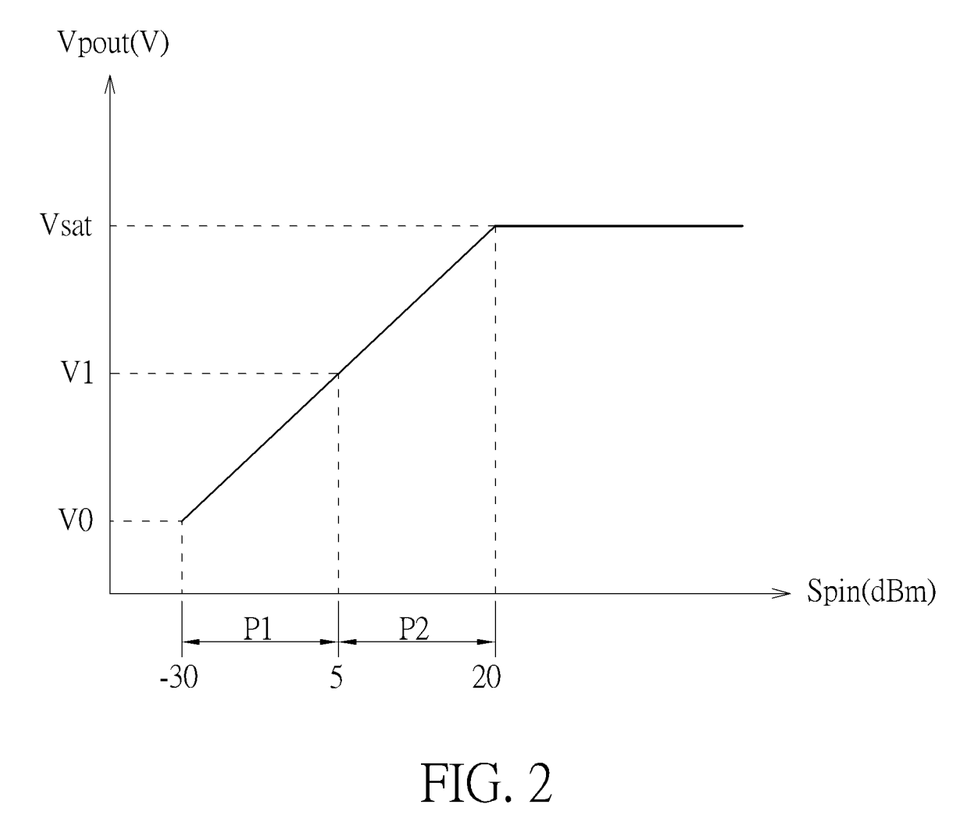
FIG. 2 shows a relationship between the input signal Spin and the output signal of the logarithmic power detector in FIG. 1.

FIG. 2 shows a relationship between the input signal Spin and the output voltage Vpout of the logarithmic power detector 1. For example, the input signal Spin may have a power range that can be divided into two power segment intervals P1, P2, the power segment interval P1 may range between −30 dBm and 5 dBm, corresponding to a range of the output voltage Vpout between voltages V0 and V1, and the power segment interval P2 may range between 5 dBm and 20 dBm, corresponding to a range of the output voltage Vpout between voltages V1 and Vsat, where the voltage V0 is the minimum value of the output voltage Vpout, and the voltage Vsat is the saturation value of the output voltage Vpout. In the power segment interval P1, the input signal Spin is at lower power, the first detecting circuit 10 and the second detecting circuit 11 may operate together to detect the power of the input signal Spin. In the power segment interval P2, the input signal Spin is at higher power, the first detecting circuit 10 or the second detecting circuit 11 may independently detect the power of the input signal Spin. By employing the detecting circuits 10 and 11 to detect the power of the input signal Spin for different power segment intervals, the logarithmic power detector 1 may generate the output voltage Vpout substantially proportional to the power of the input signal Spin.

The input terminal 100 may be coupled to the power distributor 102. The first detecting circuit 10 may be coupled to the power distributor 102 and the output circuit 116, and may include a first half-wave rectifier 104, a first low-pass filter 106, and a first buffer 108. The second detecting circuit 11 may be coupled to the power distributor 102 and the output circuit 116, and may include a second half-wave rectifier 110, a second low-pass filter 112 and a second buffer 114. The power distributor 102 may be coupled to the first half-wave rectifier 104 and the second half-wave rectifier 110. The first half-wave rectifier 104 may be coupled to the first low-pass filter 106, and then the first low-pass filter 106 may be coupled to the first buffer 108. Similarly, the second half-wave rectifier 110 may be coupled to the second low-pass filter 112, and the second low-pass filter 112 may be coupled to the second buffer 114. The first buffer 108 and the second buffer 114 may be coupled to the output circuit 116. The output circuit 116 may be coupled to the output terminal 118.

The input terminal 100 may receive the input signal Spin. The power distributor 102 may generate the first power signal Sp1 and the second power signal Sp2 according to the input signal Spin. The magnitudes of the first power signal Sp1 and the second power signal Sp2 may be proportional to the power of the input signal Spin. The magnitudes of the first power signal Sp1 and the second power signal Sp2 may be identical or different.

The first half-wave rectifier 104 may attenuate half cycles of the first power signal Sp1 to generate a first rectified signal Sr1. In some embodiments, the first half-wave rectifier 104 may ideally attenuate all positive portions of the first power signal Sp1 to generate a first rectified signal Sr1 and retain negative portions of the first power signal Sp1. In other embodiments, the first half-wave rectifier 104 may attenuate some of the positive portions of the first power signal Sp1 to generate the first rectified signal Sr1 while retaining the negative portions of the first power signal Sp1. The first rectified signal Sr1 may pass through the first low-pass filter 106 to generate a first low-pass signal Slp1, and the first buffer 108 may amplify the first low-pass signal Slp1 to generate a first amplified current I1. In some embodiments, the first buffer 108 may be an inverting amplifier implemented by a common emitter (CE) amplifier or a common source (CS) amplifier and may generate the first amplified current I1 having positive half cycles. In other embodiments, the first half-wave rectifier 104 may substantially attenuate the negative half cycles of the first power signal Sp1 to generate the first rectified signal Sr1.

Similarly, the second half-wave rectifier 110 may attenuate half cycles of the first power signal Sp2 to generate a second rectified signal Sr2. In some embodiments, the second half-wave rectifier 110 may ideally attenuate all positive portions of the second power signal Sp2 to generate the second rectified signal Sr2 and retain negative portions of the second power signal Sp2. In other embodiments, the second half-wave rectifier 110 may attenuate some of the positive portions of the second power signal Sp2 to generate the second rectified signal Sr2 while retaining the negative portions of the second power signal Sp2. The second rectified signal Sr2 may pass through the second low-pass filter 112 to generate a second low-pass signal Slp2, and the second buffer 114 may amplify the second low-pass signal Slp2 to generate a second amplified current I2. In some embodiments, the second buffer 114 may be an inverting amplifier implemented by a common emitter amplifier or a common source amplifier and may generate the second amplified current I2 having positive half cycles. In another embodiment, the second half-wave rectifier 110 may substantially attenuate the negative half cycles of the second power signal Sp2 to generate the second rectified signal Sr2.

The output circuit 116 may receive the first amplifying current I1 and the second amplifying current I2 to generate a combined current, and generate the converted voltage Vout according to the combined current, and output the converted voltage Vout at the output terminal 118. The combined current may be a current having positive half cycles. The power of the input signal Spin is related to the magnitude of the converted voltage Vout. In some embodiments, the power of the input signal Spin may be proportional to the combined current, and the combined current may be proportional to the converted voltage Vout, and therefore, the logarithmic power detector 1 may generate a converted voltage Vout substantially proportional to the power of the input signal Spin.

Figure 3:
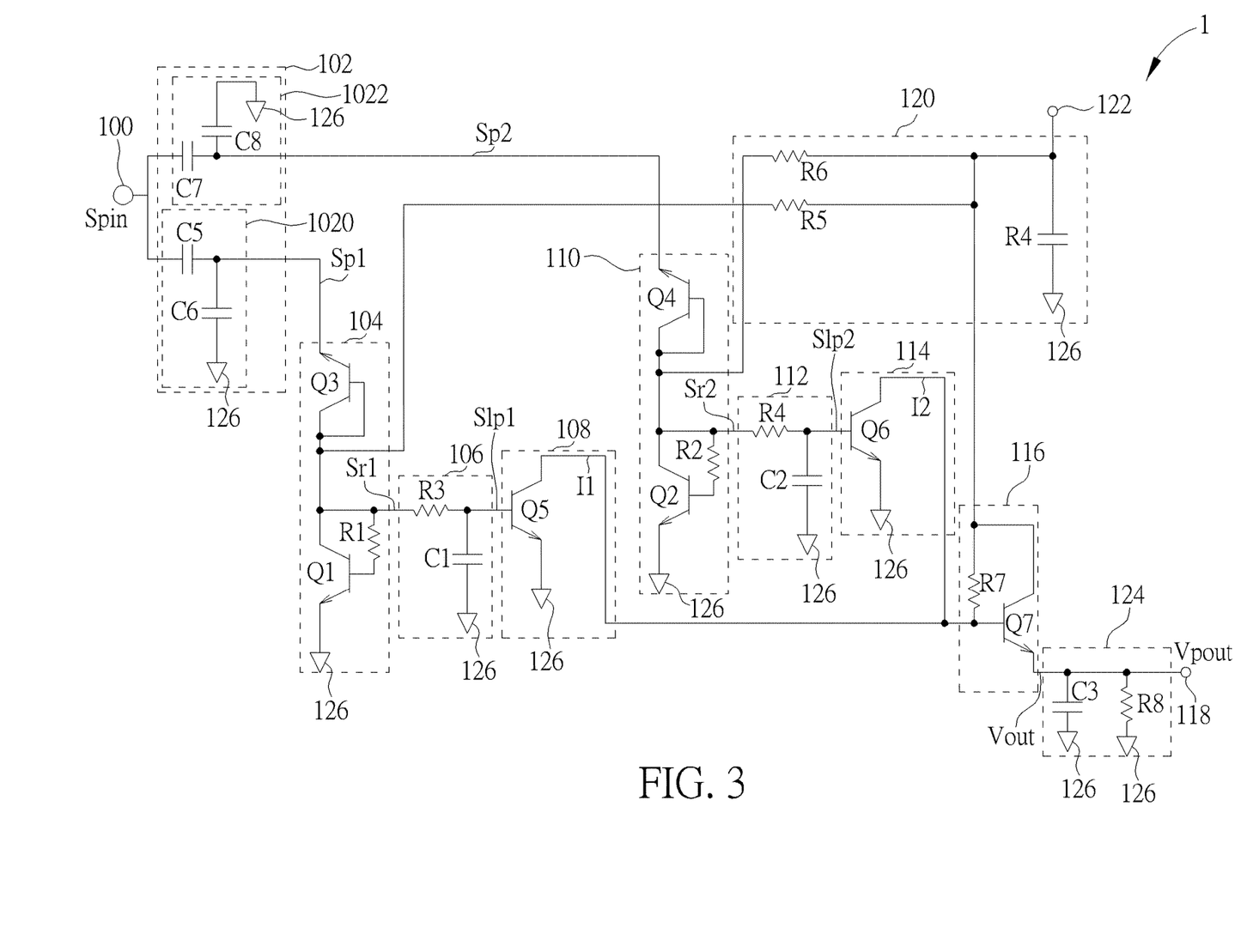
FIG. 3 is a circuit schematic of the logarithmic power detector in FIG. 1.

FIG. 3 is a circuit schematic of the logarithmic power detector 1 according to an embodiment of the invention. The logarithmic power detector 1 in FIG. 3 further includes a supply voltage terminal 122, a bias circuit 120, and an alternating current (AC) to direct current (DC) converter 124 in addition to the components of the logarithmic power detector 1 of FIG. 1. The supply voltage terminal 122 may be coupled to the bias circuit 120. The bias circuit 120 may be coupled to the first low-pass filter 106, the second low-pass filter 112, and the output circuit 116. The AC to DC converter 124 may be coupled to the output circuit 116 and the output terminal 118.

The bias circuit 120 may include resistors R5, R6. The fifth resistor R5 may be coupled between the supply voltage terminal 122 and the first low-pass filter 106, and may provide the first bias voltage to the first buffer 108 via the first half-wave rectifier 104 and the first low-pass filter 106. The sixth resistor R6 may be coupled between the supply voltage terminal 122 and the second low-pass filter 112 and may provide the second bias voltage to the second buffer 114 via the second half-wave rectifier 110 and the second low-pass filter 112.

The power distributor 102 may include a first impedance unit 1020 and a second impedance unit 1022. The first impedance unit 1020 may be coupled between the first half-wave rectifier 104 and the input terminal 100, and may generate the first power signal Sp1 according to the input signal Spin. The second impedance unit 1022 may be coupled between the second half-wave rectifier 110 and the input terminal 100, and may generate the second power signal Sp2 according to the input signal Spin. The first impedance unit 1020 may include capacitors C5 and C6, and the second impedance unit 1022 may include capacitors C7 and C8. The capacitor C5 includes a first terminal coupled to the input terminal 100, and a second terminal. The capacitor C6 includes a first terminal coupled to the second terminal of the capacitor C5, and a second terminal coupled to the reference voltage terminal 126. The capacitor C7 includes a first terminal coupled to the input terminal 100, and a second terminal. The capacitor C8 includes a first terminal coupled to the second terminal of the capacitor C7, and a second terminal coupled to the reference voltage terminal 126. In some embodiments, the first impedance unit 1020 and the second impedance unit 1022 may also include other combinations of capacitors, resistors, and inductors to generate the first power signal Sp1 and the second power signal Sp2 respectively. The impedances of the first impedance unit 1020 and the second impedance unit 1022 may be identical or different. In some embodiments, the impedance of the first impedance unit 1020 may be greater than the impedance of the second impedance unit 1022 such that the first power signal Sp1 is smaller than the second power signal Sp2. In other embodiments, the impedance of the first impedance unit 1020 may be substantially equal to the impedance of the second impedance unit 1022 such that the first power signal Sp1 is substantially equal to the second power signal Sp2. Further, the impedance of the first impedance unit 1020 may be smaller than the impedance of the second impedance unit 1022 such that the first power signal Sp1 is greater than the second power signal Sp2.

The first half-wave rectifier 104 may include transistors Q1, Q3, both are arranged in the diode configuration. The transistor Q3 may include a control terminal, a first terminal and a second terminal. The first terminal of the transistor Q3 may be coupled to the power distributor 102, and the second terminal of the transistor Q3 may be coupled to the first low-pass filter 106 and the control terminal of the transistor Q3. The transistor Q1 may include a control terminal, a first terminal and a second terminal. The first terminal of the transistor Q1 may be coupled to the second terminal of the transistor Q3, the first low-pass filter 106 and the control terminal of the transistor Q1. The second terminal of the transistor Q1 may be coupled to the reference voltage terminal 126. The reference voltage terminal 126 may provide a reference voltage such as 0V. The transistors Q1 and Q3 may perform positive half cycle filtering twice to substantially attenuate the positive half cycles of the first power signal Sp1, so as to generate the first rectified signal Sr1. During the positive half cycles of the first power signal Sp1, since the transistor Q3 is reverse biased, the positive half cycles of the first power signal Sp1 may be attenuated, and since the transistor Q1 is forward biased, the positive half cycles of the first power signal Sp1 may be further attenuated. As a result, only the negative half cycles of the first power signal Sp1 are input into the first low-pass filter 106. The first half-wave rectifier 104 may further include a resistor R1 coupled between the control terminal and the first terminal of the transistor Q1. In some embodiments, the resistor R1 may adjust the first rectified signal Sr1 to provide a suitable bias voltage to the first buffer 108. Similarly, in some embodiments, the first half-wave rectifier 104 may further include a resistor coupled between the control terminal and the second terminal of the transistor Q3 to further adjust the first rectified signal Sr1. In other embodiments, the transistor Q3 may be excluded from the first half-wave rectifier 104 to perform positive half cycle filtering on the first power signal Sp1 once to generate the first rectified signal Sr1. In some embodiments, the transistor Q1 may be replaced by a diode, with the anode of the diode being coupled to the first low-pass filter 106, and the cathode of the diode being coupled to the reference voltage terminal 126. The transistor Q3 may also be replaced by a diode, with the anode of the diode being coupled to the first low-pass filter 106, and the cathode of the diode being coupled to the power distributor 102.

The first low-pass filter 106 may include a resistor R3 and a capacitor C1. The resistor R3 may include a first terminal coupled to the first half-wave rectifier 104 and a second terminal coupled to the first buffer 108. The capacitor C1 may include a first terminal coupled to the first buffer 108 and the second terminal of the resistor R3, and a second terminal coupled to the reference voltage terminal 126. The resistor R3 and the capacitor C1 may attenuate the high frequency component of the first rectified signal Sr1 to generate the first low-pass signal Slp1. The first buffer 108 may include a transistor Q5 configured into a common emitter amplifier. The transistor Q5 may include a control terminal, a first terminal and a second terminal. The control terminal of the transistor Q5 may receive the first low-pass signal Slp1 and the first bias voltage, the first terminal of the transistor Q5 may generate the first amplified current I1, and the second terminal of the transistor Q5 may be coupled to the reference voltage terminal 126.

The second half-wave rectifier 110 may include transistors Q2, Q4, both are arranged in the diode configuration. The transistor Q4 may include a control terminal, a first terminal and a second terminal. The first terminal of the transistor Q4 may be coupled to the power distributor 102. The second terminal of the transistor Q4 may be coupled to the second low-pass filter 112 and the control terminal of the transistor Q4. The transistor Q2 may include a control terminal, a first terminal and a second terminal. The first terminal of the transistor Q2 may be coupled to the second terminal of the transistor Q4, the second low-pass filter 112 and the control terminal of the transistor Q2, and, the second terminal of the transistor Q2 may be coupled to the reference voltage terminal 126. The transistors Q2, Q4 may perform positive half cycle filtering twice to substantially attenuate the positive half cycles of the second power signal Sp2, so as to generate the second rectified signal Sr2. During the positive half cycles of the second power signal Sp2, since the transistor Q4 is reverse biased, the positive half cycles of the second power signal Sp2 may be attenuated, and, since the transistor Q2 is forward biased, the positive half cycles of the second power signal Sp2 may be further attenuated. Consequently, only the negative half cycles of the second power signal Sp2 are input into the second low-pass filter 112. The second half-wave rectifier 110 may further include a resistor R2 coupled between the control terminal and the first terminal of the transistor Q2, so as to adjust the second rectified signal Sr2 to provide a suitable bias voltage to the second buffer 114. In some embodiments, the second half-wave rectifier 110 may further include a resistor coupled between the control terminal and the second terminal of the transistor Q4 to further adjust the second rectified signal Sr2. In other embodiments, the second half-wave rectifier 110 may only include the transistor Q2 and/or the resistor R2, so as to reduce or remove the positive half cycles of the second power signal Sp2 to generate the second rectified signal Sr2. In some embodiments, the transistor Q2 may be replaced by a diode, with the anode of the diode being coupled to the second low-pass filter 112, and the cathode of the diode being coupled to the reference voltage terminal 126. The transistor Q4 may also be replaced by a diode, with the anode of the diode being coupled to the second low-pass filter 112, and the cathode of the diode being coupled to the power distributor 102.

The second low-pass filter 112 may include a resistor R4 and a capacitor C2. The resistor R4 may include a first terminal coupled to the second half-wave rectifier 110 and a second terminal coupled to the second buffer 114. The capacitor C2 may include a first terminal coupled to the second buffer 114 and the second terminal of the resistor R4, and a second terminal coupled to the reference voltage terminal 126. The resistor R4 and the capacitor C2 may attenuate the high frequency component of the second rectified signal Sr2 to generate the second low-pass signal Slp2. The second buffer 114 may include a transistor Q6 configured into a common emitter amplifier. The transistor Q6 may include a control terminal, a first terminal and a second terminal. The control terminal of the transistor Q6 may receive the second low-pass signal Slp2 and the second bias voltage, the first terminal of the transistor Q6 may generate the second amplified current I2, and the second terminal of the transistor Q6 may be coupled to the reference voltage terminal 126.

The voltages corresponding to the first power signal Sp1 and the second power signal Sp2 may be the same or different depending on the impedances of the first impedance unit 1020 and the second impedance unit 1022. In some embodiments, when the impedance of the first impedance unit 1020 is greater than the impedance of the second impedance unit 1022, the voltage corresponding to the first power signal Sp1 is less than the voltage corresponding to the second power signal Sp2. When the power of the input signal Spin is less than a predetermined segment power (e.g., 5 dBm), the voltage corresponding to the first power signal Sp1 and the voltage corresponding to the power signal Sp2 may be less than a first threshold (e.g., the saturation voltage of the transistor Q5) and a second threshold (e.g., the saturation voltage of the transistor Q6), respectively, and the power of the input signal Spin is substantially proportional to the output voltage Vpout. In other embodiments, when the power of the input signal Spin exceeds a predetermined segment power, and the impedance of the first impedance unit 1020 is still greater than the impedance of the second impedance unit 1022, the voltage of the second power signal Sp2 may exceed the second threshold, causing the transistor Q6 to enter the saturation region, and the linearity of the output voltage Vpout is determined by the transistor Q5 operating in the linear region. In other words, when the power of the input signal Spin exceeds the predetermined segment power, the first buffer 108 may be maintained in the linear region and the second buffer 114 may enter the saturation region to generate the output voltage Vpout; and, when the power of the input signal is Spin is less than the predetermined segment power, both the first buffer 108 and the second buffer 114 may be maintained in the linear region to generate the output voltage Vpout. In other embodiments, the impedance of the first impedance unit 1020 and the second impedance unit 1022, the capacitance and resistance of the first low-pass filter 106 and the second low-pass filter 112, and resistance of the bias circuit 120 may be adjusted for various power of the input signal Spin, further configuring operating ranges for the first buffer 108 and the second buffer 114, so as to increase the linearity and the operating bandwidth of the output voltage Vpout.

The output circuit 116 may include a transistor Q7 and a resistor R7. The resistor R7 may comprise a first terminal and a second terminal. The first terminal of the resistor R7 is coupled to the supply voltage terminal 122. The supply voltage terminal 122 may provide a supply voltage. The transistor Q7 may include a control terminal, a first terminal and a second terminal. The control terminal of the transistor R7 may be coupled to the first terminal of the transistor Q5, the first terminal of the transistor Q6 and the second terminal of the resistor R7. The first terminal of the transistor Q7 may be coupled to the first terminal of the resistor R7. The second terminal of the transistor Q7 may be coupled to the AC to DC converter 124. The AC to DC converter 124 may be coupled to the output terminal 118. The transistor Q7 may be configured into an emitter follower. The control terminal of the transistor Q7 may receive the first amplified current I1 and the second amplified current I2 to generate the combined current, and generate the converted voltage Vout at the second terminal of the transistor Q7 according to the combined current. The AC to DC converter 124 may include a capacitor C3 and a resistor R8 to convert the converted voltage Vout into the DC output voltage Vpout. Since the first half-wave rectifier 104 and the second half-wave rectifier 110 may substantially attenuate the positive half cycles of the first power signal Sp1 and the second power signal Sp2, the generated the output voltage Vpout is not prone to interference from other half cycles, leading to increased linearity.

The transistors Q1 to Q7 may be bipolar junction transistors (BJT) or metal-oxide-semiconductor field-effect transistors (MOSFETs).

The logarithmic power detector 1 generates the first power signal Sp1 and the second power signal Sp2 by the power distributor 102, performs positive half cycle filtering twice using two diodes or two diode-connected transistors to attenuate the positive half cycles of the power signals Sp1 and Sp2, and outputs the output voltage Vpout substantially proportional to the input signal Spin by the first detecting circuit 10 and/or the second detecting circuit 11, thereby increasing the linearity of the output voltage Vpout.

Figure 4:
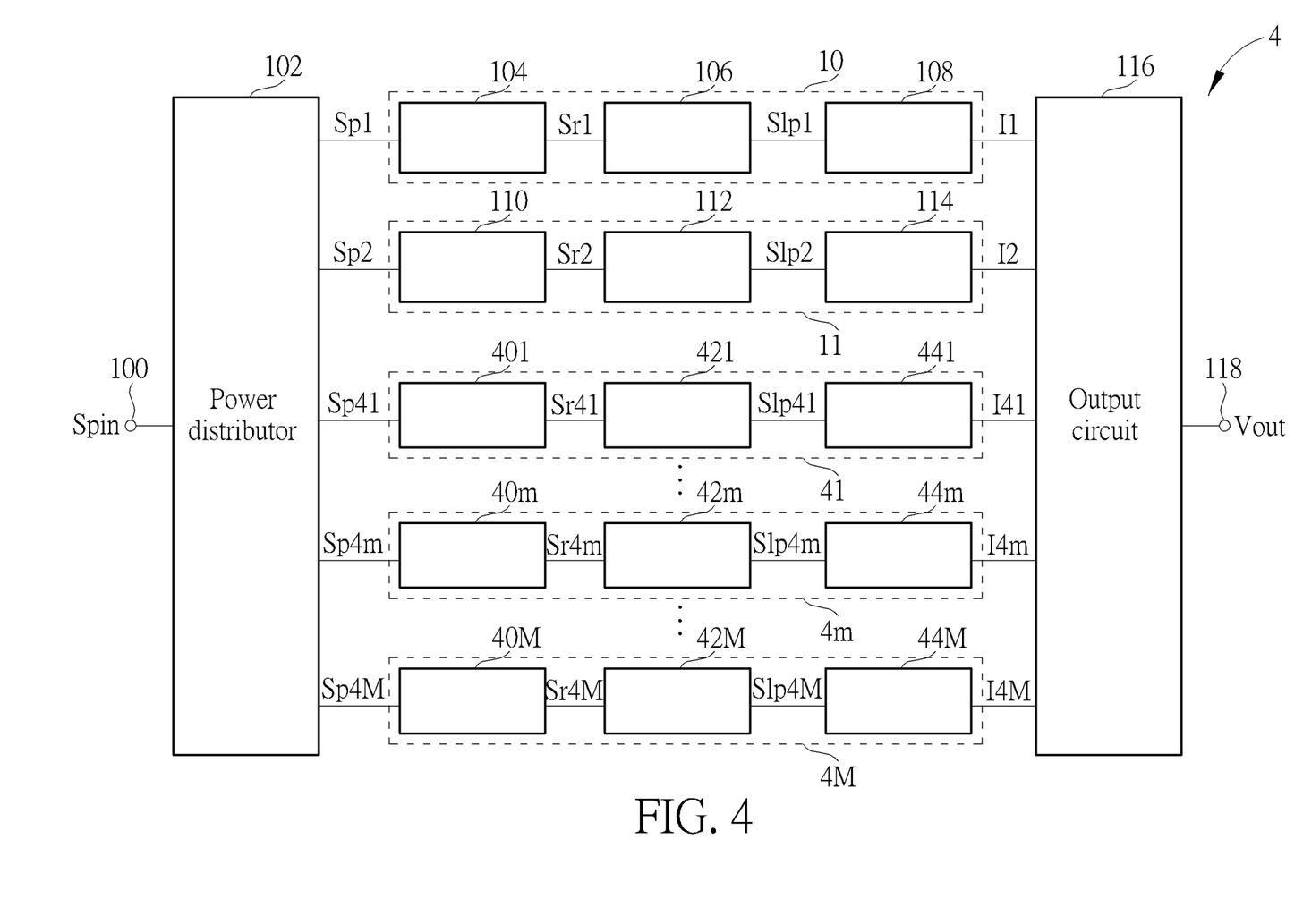
FIG. 4 is a block diagram of a logarithmic power detector according to another embodiment of the invention.

FIG. 4 is a block diagram of a logarithmic power detector 4 according to another embodiment of the invention. The connection and operation of the first detecting circuit 10 and the second detecting circuit 11 in the logarithmic power detector 4 have been described in the foregoing paragraphs, and will not be described herein. The logarithmic power detector 4 further includes M detecting circuits 41 to 4M in addition to the components of the logarithmic power detector 1, respectively coupled to the power distributor 102 and the output circuit 116, M being a positive integer. For example, when M=1, the logarithmic power detector 4 has three detecting circuits for detecting circuits detecting three power segment intervals, e.g., a low-power segment interval between −30 dBm and 5 dBm, an intermediate-power segment interval between 5 dBm and 20 dBm, and a high-power power segment interval exceeding 20 dBm. In the low-power segment interval, the first detecting circuit 10, the second detecting circuit 11 and the detecting circuit 41 may operate together to detect the power of the input signal Spin; in the intermediate-power segment interval, the first detecting circuit 10 and the second detecting circuit 11 may operate together to detect the power of the input signal Spin; and, in the high-power segment interval, the first detecting circuit 10 may independently detect the power of the input signal Spin. The larger value of M, the larger range the logarithmic power detector 4 may detect the power of the input signal Spin.

The mth detecting circuit 4m of the M detecting circuits 41 to 4M may include an mth half-wave rectifier 40m, an mth low-pass filter 42m, and an mth buffer 44m, where m is a positive integer and m is less than or equal to M. The power distributor 102 may be coupled to the mth half-wave rectifier 40m. The mth half-wave rectifier 40m may be coupled to the mth low-pass filter 42m, the mth low-pass filter 42m may be coupled to the mth buffer 44m, and the mth buffer 44m may be coupled to the output circuit 116. The power distributor 102 may generate an mth power signal Sp4m according to the input signal Spin, and the magnitude thereof may be proportional to the power of the input signal Spin. The first power signal Sp1, the second power signal Sp2, and the M power signals Sp41 to Sp4M may be identical or different in magnitude. The mth half-wave rectifier 40m may attenuate half cycles of the mth power signal Sp4m to generate an mth rectified signal Sr4m. In some embodiments, the mth half-wave rectifier 40m may ideally attenuate all positive portions of the mth power signal Sp4$m$ to generate an mth rectified signal Sr4$m$. In other embodiments, the mth half-wave rectifier 40$m$ may attenuate some of the positive portions of the mth power signal Sp4$m$ to generate the mth rectified signal Sr4$m$. The mth rectified signal Sr4$m$ may include the negative half cycles of the mth power signal Sp4$m$. The mth rectified signal Sr4$m$ may pass through the mth low-pass filter 42$m$ to generate an mth low-pass signal Slp4$m$, and the mth buffer 44$m$ may amplify the mth low-pass signal Slp4$m$ to generate an mth amplified current I4$m$. In some embodiments, the mth buffer 44$m$ may be an inverting amplifier implemented by a common emitter amplifier or a common source amplifier, and generating the mth amplified current I4$m$ having positive half cycles.

The output circuit 116 may receive the first amplified current I1, the second amplified current I2 and the amplified currents I41 to I4M to generate a combined current, and generate a converted voltage Vout according to the combined current.

The logarithmic power detector 4 may increase the range of detecting the power of the input signal Spin by the detecting circuits 41 to 4M.

Figure 5:
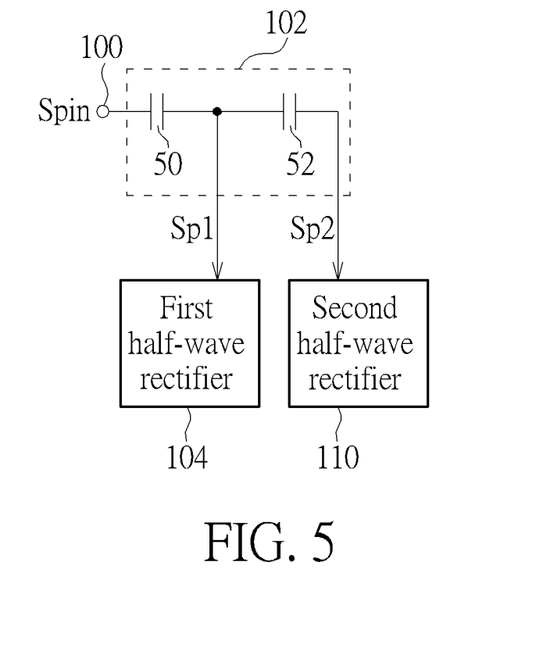
FIG. 5 is a circuit diagram of another power distributor in FIG. 1.

FIG. 5 is a circuit schematic of another power distributor 102, including a first impedance unit 50 and a second impedance unit 52. The first impedance unit 50 may be a capacitor generating the first power signal Sp1 according to the input signal Spin, and including a first terminal coupled to the input terminal 100 and a second terminal coupled to the first half-wave rectifier 104. The first impedance unit 52 may be a capacitor generating the second power signal Sp2 according to the input signal Spin, and including a first terminal coupled to the first half-wave rectifier 104 and a second terminal coupled to the second half-wave rectifier 110 and the reference voltage terminal 126. In some embodiments, the first impedance unit 50 and the second impedance unit 52 may also include other combinations of capacitors, resistors, and inductors to generate the first power signal Sp1 and the second power signal Sp2, respectively. The impedance of the first impedance unit 50 and the second impedance unit 52 may be identical or different.

Figure 6:
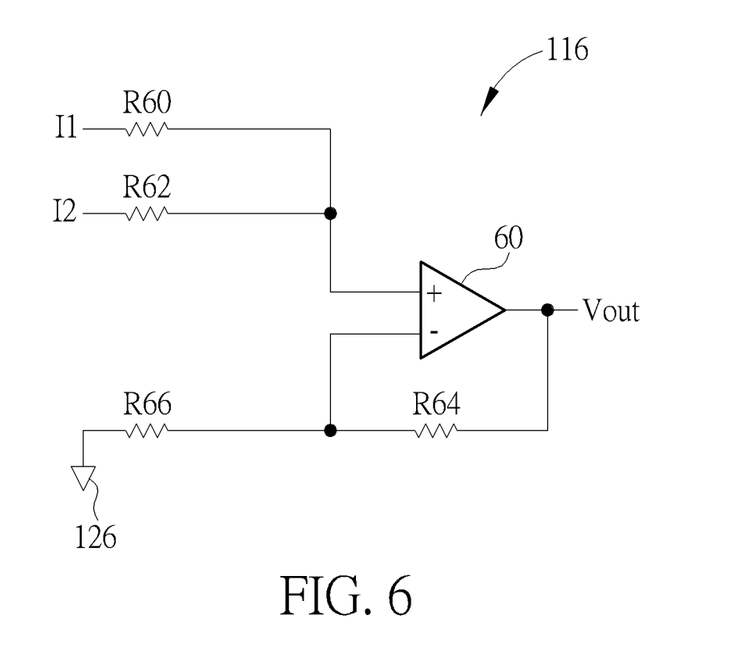
FIG. 6 is a circuit diagram of another output circuit in FIG. 1.

FIG. 6 is a circuit schematic of another output circuit 116 including an operational amplifier 60 and adder resistors R60 to R66. The operational amplifier 60 includes a non-inverting input terminal, an inverting input terminal and an output terminal. The adder resistor R60 includes a first terminal coupled to the first buffer 108 to receive the first amplified current I1, and a second terminal coupled to the non-inverting input terminal of the operational amplifier 60. The adder resistor R62 includes a first terminal coupled to the second buffer 114 to receive the second amplified current I2, and a second terminal coupled to the non-inverting input terminal of the operational amplifier 60. The adder resistor R64 includes a first terminal coupled to the output terminal of the operational amplifier 60, and a second terminal coupled to the inverting input terminal of the operational amplifier 60. The adder resistor R66 includes a first terminal coupled to the inverting input terminal of the operational amplifier 60 and a second terminal coupled to the reference voltage terminal 126. The first amplified current I1 and the second amplified current I2 may be combined at the non-inverting input terminal of the operational amplifier 60 to generate the combined current, and the operational amplifier 60 may convert the combined current into the converted voltage Vout at the output terminal of the operational amplifier 60.

Figure 7:
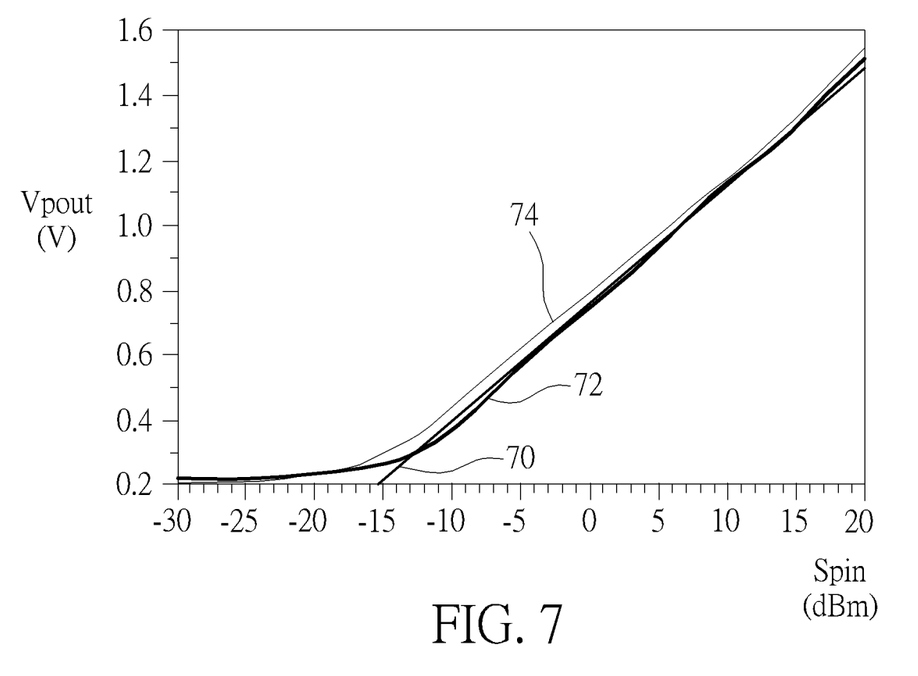
FIG. 7 shows a simulation of the output signal of the logarithmic power detector in FIG. 1.

FIG. 7 shows a simulation of the output voltage Vpout generated by the logarithmic power detector 1 in response to the input signal Spin. Line 70 indicates a reference line, Simulation curve 72 indicates a simulated signal at the output of the first half-wave rectifier 104 or the second half-wave rectifier 110 respectively employing two diodes or two diode-connected transistors, and, Simulation curve 74 indicates a simulated signal at the output of the first half-wave rectifier 104 or the second half-wave rectifier 110 respectively employing one diode or one diode-connected transistor. As can be seen in FIG. 7, Simulation curve 72 is closer to Line 70 in comparison to Simulation line 74, having a higher degree of linearity. Thus by employing two diodes or two diode-connected transistors to attenuate the positive half cycles of the first power signal Sp1 and the second power signal Sp2, the output voltage Vpout would have a higher degree of linearity.

Figure 8:
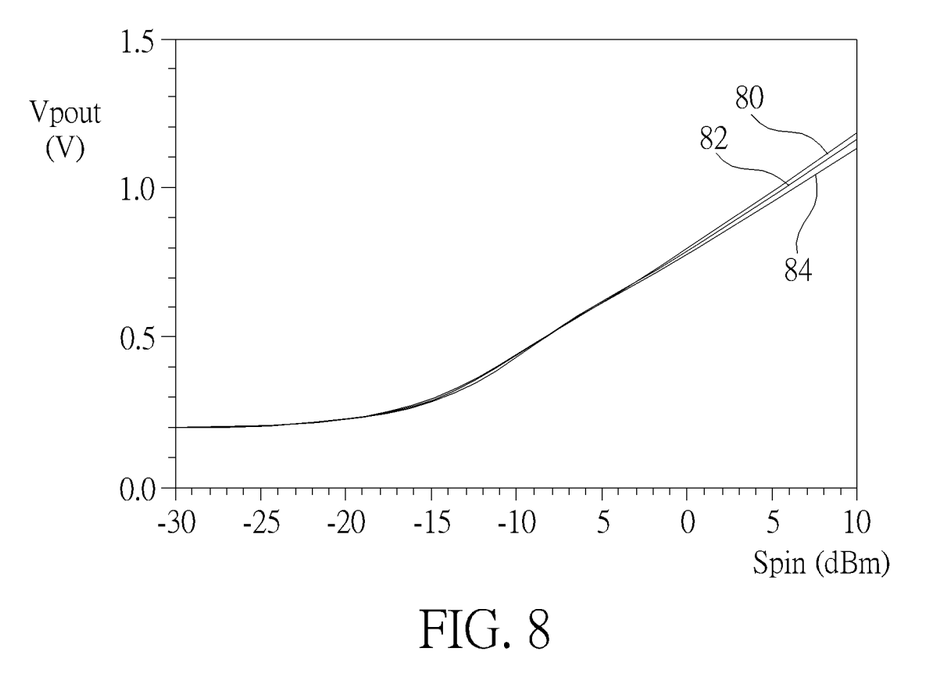
FIG. 8 shows the frequency response of the logarithmic power detector in FIG. 1.

FIG. 8 shows the frequency response of the logarithmic power detector 1, wherein Simulation curves 80, 82 and 84 respectively represent simulated output voltages Vpout corresponding to 5 GHz, 5.5 GHz and 6 GHz of the input signal Spin. As can be seen in FIG. 8, for given power of the input signal Spin, the differences between the output voltages Vpout of Simulation curves 80, 82 and 84 are small, e.g., less than 0.1V. In other words, when the logarithmic power detector 1 employing two diodes or two diode-connected transistors is used to detect the input voltages Spin at different frequency bands, the output voltages Vpout are almost the same, and therefore, the operating bandwidth is increased.

Figure 9:
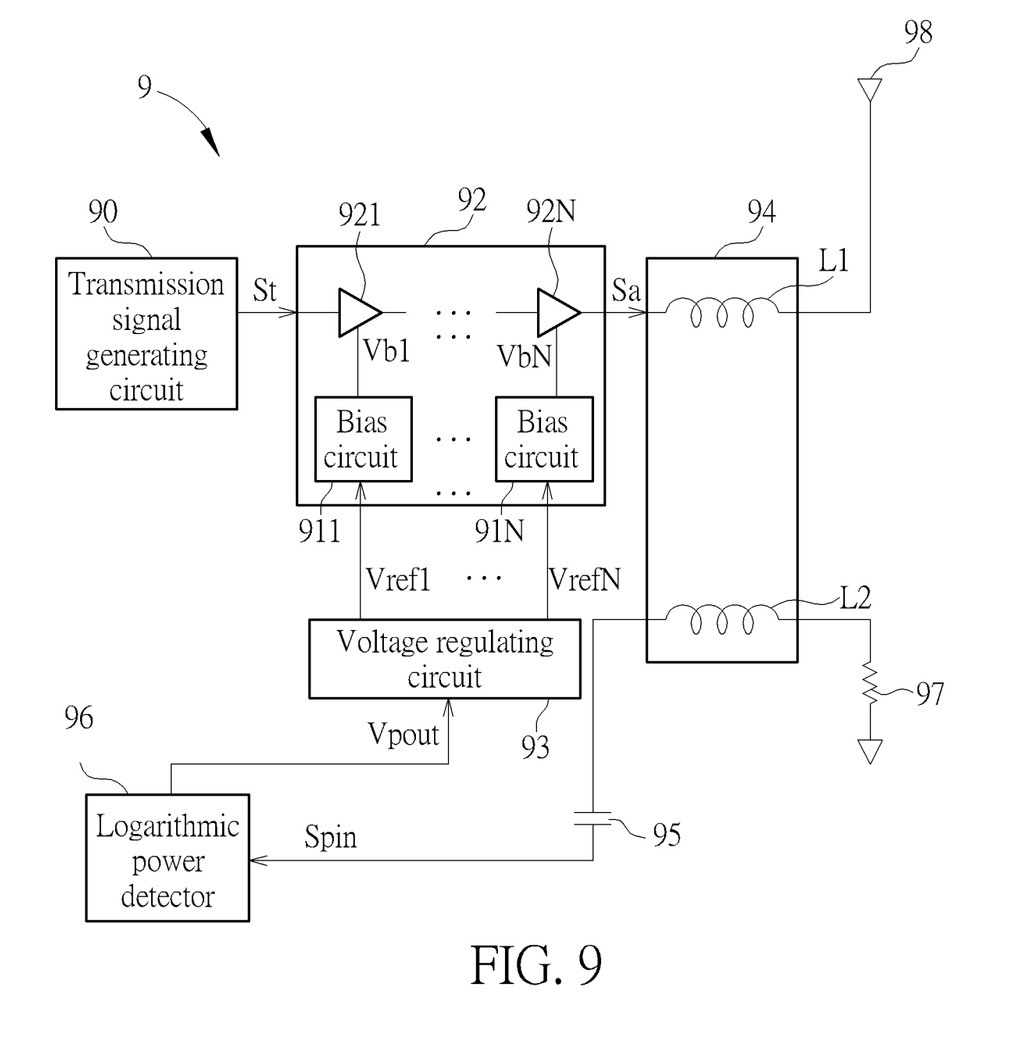
FIG. 9 is a circuit schematic of a transmission circuit adopting the logarithmic power detector in FIG. 1.

FIG. 9 is a schematic diagram of a transmission circuit 9 employing the logarithmic power detector in FIG. 1, 3 or 4. The transmission circuit 9 may include a transmission signal generating circuit 90, a power amplifier 92, a voltage regulating circuit 93, a coupler 94, a capacitor 95, a logarithmic power detector 96, a resistor 97, and an antenna 98. The transmission signal generating circuit 90 is coupled to the power amplifier 92. The power amplifier 92 is coupled to the coupler 94. The coupler 94 is coupled to the antenna 98, the capacitor 95 and the resistor 97. The resistor 97 is coupled between the coupler 94 and the reference voltage terminal. The capacitor 95 is coupled between the coupler 94 and the logarithmic power detector 96. The voltage regulating circuit 93 is coupled between the logarithmic power detector 96 and the power amplifier 92.

The transmission signal generating circuit 90 may generate a transmission signal St. The power amplifier 92 may amplify the transmission signal St to generate an amplified signal Sa, and the amplified signal Sa is then transmitted via the coupler 94 and the antenna 98. The power amplifier 92 may include N sequentially coupled amplification stages 921 to 92N and N bias circuits 911 to 91N respectively coupled to the amplification stages 921 to 92N, N being a positive integer, e.g., N=3. The first amplification stage 921 may receive the transmission signal St, the last amplification stage 92N may generate the amplified signal Sa, and each amplification stage may be a variable-gain amplifier. The coupler 94 may include inductors L1 and L2. In some embodiments, when passing through the coupler 94, a portion of the amplified signal Sa is coupled to the inductor L2, and the portion of the amplified signal Sa is then used to generate the input signal Spin by the capacitor 95. The logarithmic power detector 96 may receive the input signal Spin and generate an output voltage Vpout substantially proportional to the power of the input signal Spin, and transmit the output voltage Vpout to the voltage regulating circuit 93. The voltage regulating circuit 93 may generate N reference voltages Vref1 to VrefN, and transmit the N reference voltages Vref1 to VrefN respectively to the bias circuits 911 to 91N, and the bias circuits 911 to 91N may generate bias voltages Vb1 to VbN according to the reference voltages Vref1 to VrefN respectively, and transmit the bias voltages Vb1 to VbN to the amplification stages 921 to 92N respectively, thereby controlling the gains of the amplification stages 921 to 92N. In some embodiments, the bias circuits 911 to 91N may update one or more of the bias voltages Vb1 to VbN in accordance with the reference voltages Vref1 to VrefN respectively. In other embodiments, the bias circuits 911 to 91N may update all of the bias voltages Vb1 to VbN in accordance with the reference voltages Vref1 to VrefN, respectively.

In some embodiments, the power amplifier 92 may send an nth output signal of an nth amplification stage of the N amplification stages 921 to 92N to the coupler 94 to couple a portion of the nth output signal to the inductor L2, so as to generate the input signal Spin via the capacitor 95, n being a positive integer and less than or equal to N. The logarithmic power detector 96 may generate the output voltage Vpout according to the input signal Spin, the voltage adjusting circuit 93 may generate the reference voltages Vref1 to VrefN according to the output voltage Vpout, and the bias circuits 911 to 91N may generate the bias voltages Vb1 to VbN according to the reference voltages Vref1 to VrefN, respectively, and the amplification stages 921 to 92N may control the gains of the amplification stages 921 to 92N according to the bias voltages Vb1 to VbN, respectively. In some embodiments, the logarithmic power detector 96 may also transmit the output voltage Vpout to the transmission signal generating circuit 90 to control the transmission power of the amplification signal Sa. The signal generating circuit 90 may be, but is not limited to, a baseband circuit, the voltage regulating circuit 93 may be, but is not limited to, a low dropout regulator (LDO). In other embodiments, the logarithmic power detector 96 may receive the input signal Spin and generate an output voltage Vpout substantially negatively proportional to the power of the input signal Spin.

The logarithmic power detector in FIG. 1, 3 or 4 employs a plurality of detecting circuits to generate by segments an output voltage Vpout that is substantially proportional to the power of the input signal Spin, and increases the linearity and operating bandwidth of the output voltage Vpout of the logarithmic power detector by employing two diodes or two diode-connected transistors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A logarithmic power detector comprising:
   an input terminal configured to receive an input signal;
   a power distributor coupled to the input terminal and configured to generate a first power signal and a second power signal according to the input signal;
   a first detecting circuit coupled to the power distributor and comprising:
      a first half-wave rectifier coupled to the power distributor and configured to attenuate half cycles of the first power signal to generate a first rectified signal;
      a first low-pass filter coupled to the first half-wave rectifier and configured to pass the first rectified signal to generate a first low-pass signal; and
      a first buffer coupled to the first low-pass filter and configured to amplify the first low-pass signal to generate a first amplified current;
   a second detecting circuit coupled to the power distributor and comprising:
      a second half-wave rectifier coupled to the power distributor and configured to attenuate half cycles of the second power signal to generate a second rectified signal;
      a second low-pass filter coupled to the second half-wave rectifier and configured to pass the second rectified signal to generate a second low-pass signal; and
      a second buffer coupled to the second low-pass filter and configured to amplify the second low-pass signal to generate a second amplified current; and
   an output circuit coupled to the first buffer and the second buffer and configured to receive the first amplified current and the second amplified current to generate a converted voltage;
   wherein the converted voltage is related to power of the input signal.

2. The logarithmic power detector of claim 1, wherein the power distributor comprises:
   a first impedance unit coupled to the first half-wave rectifier and the input terminal and configured to generate the first power signal according to the input signal; and
   a second impedance unit coupled to the second half-wave rectifier and the input terminal and configured to generate the second power signal according to the input signal.

3. The logarithmic power detector of claim 2, wherein the first impedance unit comprises a capacitor, a resistor or a coupler, and the second impedance unit comprises a capacitor, a resistor or a coupler.

4. The logarithmic power detector of claim 1, wherein the power distributor comprises:
   a first impedance unit configured to generate the first power signal according to the input signal and comprising a first terminal coupled to the input terminal and a second terminal coupled to the first half-wave rectifier; and
   a second impedance unit configured to generate the second power signal according to the input signal and comprising a first terminal coupled to the first half-wave rectifier and a second terminal coupled to the second half-wave rectifier.

5. The logarithmic power detector of claim 4, wherein the first impedance unit comprises a capacitor, a resistor or a coupler, and the second impedance unit comprises a capacitor, a resistor or a coupler.

6. The logarithmic power detector of claim 1, wherein the half cycles are positive half cycles.

7. The logarithmic power detector of claim 1, wherein:
   the first half-wave rectifier comprises a first diode comprising:
      an anode coupled to the power distributor and the first low-pass filter; and
      a cathode coupled to a reference voltage terminal; and
   the second half-wave rectifier comprises a second diode comprising:
      an anode coupled to the power distributor and the second low-pass filter; and
      a cathode coupled to the reference voltage terminal.

8. The logarithmic power detector of claim 7, wherein:
the first half-wave rectifier further comprises a third diode comprising:
   an anode coupled to the anode of the first diode and the first low-pass filter; and
   a cathode coupled to the power distributor; and
the second half-wave rectifier further comprises a fourth diode comprising:
   an anode coupled to the anode of the second diode and the second low-pass filter; and
   a cathode coupled to the power distributor.

9. The logarithmic power detector of claim 1, wherein:
the first half-wave rectifier comprises a first transistor comprising:
   a control terminal;
   a first terminal coupled to the power distributor, the first low-pass filter and the control terminal of the first transistor; and
   a second terminal coupled to a reference voltage terminal; and
the second half-wave rectifier comprises a second transistor comprising:
   a control terminal;
   a first terminal coupled to the power distributor, the second low-pass filter and the control terminal of the second transistor; and
   a second terminal coupled to the reference voltage terminal.

10. The logarithmic power detector of claim 9, wherein:
the first half-wave rectifier further comprises a first resistor coupled between the first terminal of the first transistor and the control terminal of the first transistor; and
the second half-wave rectifier further comprises a second resistor coupled between the first terminal of the second transistor and the control terminal of the second transistor.

11. The logarithmic power detector of claim 9, wherein:
the first half-wave rectifier comprises a third transistor comprising:
   a control terminal;
   a first terminal coupled to the power distributor; and
   a second terminal coupled to the first terminal of the first transistor, the first low-pass filter and the control terminal of the third transistor; and
the second half-wave rectifier comprises a fourth transistor comprising:
   a control terminal;
   a first terminal coupled to the power distributor; and
   a second terminal coupled to the first terminal of the second transistor, the second low-pass filter and the control terminal of the fourth transistor.

12. The logarithmic power detector of claim 1, wherein:
the first low-pass filter comprising:
   a third resistor comprising a first terminal coupled to the first half-wave rectifier and a second terminal coupled to the first buffer; and
   a first capacitor comprising a first terminal coupled to the first buffer and the second terminal of the third resistor and a second terminal coupled to a reference voltage terminal; and
the second low-pass filter comprising:
   a fourth resistor comprising a first terminal coupled to the second half-wave rectifier and a second terminal coupled to the second buffer; and
   a second capacitor comprising a first terminal coupled to the second buffer and the second terminal of the fourth resistor and a second terminal coupled to the reference voltage terminal.

13. The logarithmic power detector of claim 1, wherein the first buffer comprises a first amplifier, and the second buffer comprises a second amplifier.

14. The logarithmic power detector of claim 13, wherein the first amplifier and the second amplifier are inverting amplifiers.

15. The logarithmic power detector of claim 1, wherein the output circuit comprises a third buffer coupled to the first buffer and the second buffer and configured to receive the first amplified current and the second amplified current to generate the converted voltage.

16. The logarithmic power detector of claim 1, wherein the output circuit comprises an adder comprising:
   an operational amplifier comprising a non-inverting input terminal, an inverting input terminal and an output terminal;
   a first adder resistor comprising a first terminal coupled to the first buffer and a second terminal coupled to the non-inverting input terminal of the operational amplifier;
   a second adder resistor comprising a first terminal coupled to the second buffer and a second terminal coupled to the non-inverting input terminal of the operational amplifier;
   a third adder resistor comprising a first terminal coupled to the output terminal of the operational amplifier and a second terminal coupled to the inverting input terminal of the operational amplifier; and
   a fourth adder resistor comprising a first terminal coupled to the inverting input terminal of the operational amplifier and a second terminal coupled to a reference voltage terminal.

17. The logarithmic power detector of claim 1, wherein:
the power distributor is further configured to generate M power signals according to the input signal;
the logarithmic power detector further comprises:
   M detecting circuits coupled to the power distributor and the output circuit, an mth detecting circuit of the M detecting circuits comprising:
      an mth half-wave rectifier coupled to the power distributor and configured to attenuate half cycles of an mth power signal of the M power signals to generate an mth rectified signal;
      an mth low-pass filter coupled to the mth half-wave rectifier and configured to pass the mth rectified signal to generate an mth low-pass signal; and
      an mth buffer coupled to the mth low-pass filter and configured to amplify the mth low-pass signal to generate an mth amplified current;
      wherein M and m are positive integers, and m<=M; and
the output circuit is configured to receive the first amplified current, the second amplified current and the M amplified currents to generate the converted voltage.

18. The logarithmic power detector of claim 1, further comprising an AC (alternating current) to DC (direct current) converter coupled to the output circuit and configured to convert the converted voltage into an output voltage.

19. The logarithmic power detector of claim 18, wherein when the second power signal exceeds a threshold value, the first buffer is configured to determine linearity of the output voltage.

20. The logarithmic power detector of claim 18, wherein the output voltage is proportional to a power segment of the input signal.

21. The logarithmic power detector of claim 1, further comprising a bias circuit coupled to the first low-pass filter, the second low-pass filter and the output circuit and comprising:
   a fifth resistor coupled between a supply voltage terminal and the first low-pass filter and configured to provide a first bias voltage to the first buffer through the first low-pass filter; and
   a sixth resistor coupled between the supply voltage terminal and the second low-pass filter and configured to provide a second bias voltage to the second buffer through the second low-pass filter.

* * * * *